United States Patent
Hanusiak et al.

(10) Patent No.: US 11,277,327 B2
(45) Date of Patent: Mar. 15, 2022

(54) PREDICTIVE ANALYTICS OF DEVICE PERFORMANCE

(71) Applicant: International Business Machines Corporation, Armonk, NY (US)

(72) Inventors: Tomasz Hanusiak, Cracow (PL); Konrad W. Komnata, Cracow (PL); Jaroslaw Osinski, Mrozy (PL); Grzegorz P. Szczepanik, Cracow (PL)

(73) Assignee: International Business Machines Corporation, Armonk, NY (US)

( * ) Notice: Subject to any disclaimer, the term of this patent is extended or adjusted under 35 U.S.C. 154(b) by 265 days.

(21) Appl. No.: 16/599,303

(22) Filed: Oct. 11, 2019

(65) Prior Publication Data

US 2020/0044952 A1 Feb. 6, 2020

Related U.S. Application Data

(63) Continuation of application No. 15/825,447, filed on Nov. 29, 2017, now Pat. No. 10,560,366.

(51) Int. Cl.
*H04L 12/26* (2006.01)
*H04L 43/50* (2022.01)
*H04L 43/0811* (2022.01)
*G01R 31/3183* (2006.01)
*G06Q 10/00* (2012.01)
(Continued)

(52) U.S. Cl.
CPC ...... *H04L 43/50* (2013.01); *G01R 31/318342* (2013.01); *G06Q 10/20* (2013.01); *H04L 43/0811* (2013.01); *H04L 43/0817* (2013.01); *G06F 3/0616* (2013.01);
(Continued)

(58) Field of Classification Search
CPC .. G06F 11/0793; G06F 3/0616; G06F 11/008; G06F 11/3072; G06F 11/34; G06F 11/3452
See application file for complete search history.

(56) References Cited

U.S. PATENT DOCUMENTS 9,714,885 B2 * 7/2017 Qin .................. G06N 3/086
9,800,477 B2 * 10/2017 Burton ............... H04L 41/5029
(Continued)

OTHER PUBLICATIONS

IBM, "Patent Applications Treated As Related", Appendix P, Filed Herewith, 2 pages.

*Primary Examiner* — Barbara B Anyan
(74) *Attorney, Agent, or Firm* — Sonny Z. Zhan

(57) ABSTRACT

Aspects of the present invention disclose a method, computer program product, and system for determining recommendations for actions based on analysis of a device. The method includes retrieving information associated with a device from one or more databases. The method further includes determining information relevant to device performance as a function of an analysis of the retrieved information associated with the device, where the information relevant to device performance includes one or more factors related to an expected device performance. The method further includes determining a frequency of repair and replacement of one or more components of the device. The method further includes determining a recommendation of an action based on a comparison of an expected frequency of replacement and repair of the components of the device to the determined replacement and repair of the components of the device.

20 Claims, 3 Drawing Sheets

(51) Int. Cl.
*H04L 43/0817* (2022.01)
*G06F 11/00* (2006.01)
*G06F 3/06* (2006.01)
*G06F 11/30* (2006.01)
*G06F 11/34* (2006.01)

(52) U.S. Cl.
CPC ........ *G06F 11/008* (2013.01); *G06F 11/3072* (2013.01); *G06F 11/34* (2013.01)

(56) References Cited

U.S. PATENT DOCUMENTS

| | | | |
|---|---|---|---|
| 2002/0128810 A1* | 9/2002 | Craig | G05B 19/41805 703/17 |
| 2006/0271547 A1* | 11/2006 | Chen | G06F 16/1844 |
| 2010/0191884 A1 | 7/2010 | Holenstein et al. | |
| 2012/0257239 A1* | 10/2012 | Tsongas | G06Q 10/20 358/1.14 |
| 2013/0232094 A1 | 9/2013 | Anderson et al. | |
| 2016/0036655 A1* | 2/2016 | Burton | H04L 41/5029 709/223 |
| 2016/0071334 A1* | 3/2016 | Johnson | G06Q 10/20 701/29.1 |
| 2016/0103662 A1* | 4/2016 | Di Balsamo | G06F 8/36 717/107 |
| 2016/0132372 A1 | 5/2016 | Anderson et al. | |
| 2016/0140514 A1* | 5/2016 | Kogan | G06Q 10/20 705/7.22 |
| 2016/0378076 A1 | 12/2016 | Hill et al. | |
| 2017/0097860 A1 | 4/2017 | Pang | |
| 2017/0115902 A1* | 4/2017 | Franke | G06F 13/4282 |
| 2017/0115903 A1* | 4/2017 | Franke | G06F 11/20 |
| 2017/0315753 A1* | 11/2017 | Blount | G06F 3/0649 |
| 2018/0189990 A1 | 7/2018 | Cardno et al. | |
| 2018/0335772 A1* | 11/2018 | Gorinevsky | G06Q 10/20 |
| 2019/0166034 A1 | 5/2019 | Hanusiak et al. | |

\* cited by examiner

PREDICTIVE ANALYTICS OF DEVICE PERFORMANCE

BACKGROUND

The present invention relates generally to the field of analytics, and more particularly to predictive analytics.

The Internet of things (IoT) is the network of physical devices, vehicles, and other items embedded with electronics, software, sensors, actuators, and network connectivity which enable these objects to collect and exchange data.

The IoT allows objects to be sensed or controlled remotely across existing network infrastructure, creating opportunities for more direct integration of the physical world into computer-based systems, and resulting in improved efficiency, accuracy, and economic benefit, in addition to reduced human intervention. When IoT is augmented with sensors and actuators, the technology becomes an instance of the more general class of cyber-physical systems, which also encompasses technologies, such as smart grids, virtual power plants, smart homes, intelligent transportation, and smart cities. Each device is uniquely identifiable through its embedded computing system but is able to interoperate within the existing Internet infrastructure. Connected physical devices utilize sensors to incorporate predictive analytics to their operational network infrastructure.

Predictive analytics is often defined as predicting at a more detailed level of granularity, i.e., generating predictive scores (probabilities) for each individual organizational element. "Predictive analytics—Technology that learns from experience (data) to predict the future behavior of individuals in order to drive better decisions that analyze current and historical facts to make predictions about future or otherwise unknown events.

SUMMARY

According to one embodiment of the present invention, a method for determining recommendations for actions based on analysis of a device is provided. The method for determining recommendations for actions based on analysis of a device may include one or more processors retrieving information associated with a device from one or more databases. The method further includes one or more processors determining information relevant to device performance as a function of an analysis of the retrieved information associated with the device, where the information relevant to device performance includes one or more factors related to an expected device performance. The method further includes one or more processors determining a frequency of repair and replacement of one or more components of the device. The method further includes one or more processors determining a recommendation of an action based on a comparison of an expected frequency of replacement and repair of the components of the device to the determined replacement and repair of the components of the device.

DETAILED DESCRIPTION

Embodiments of the present invention recognize that cognitive products are generalized examples of Internet of Things (IoT) connected devices. Cognitive products are active, digital, can operate to some extent autonomously utilizing network communication, are reconfigurable, and have local control of the resources that cognitive products need, such as energy and data storage. Cognitive products have the ability to sense, interpret, and react to events occurring in the physical world. Cognitive products have the ability to receive feedback from network based analytics and to provide feedback to a user in terms of input, output, and control.

Embodiments of the present invention recognize that current approaches to analyzing cognitive products, and determining a recommendation to a use, based on feedback from the cognitive products, can present a challenge to producers of cognitive products to clean, process, and interpret vast amounts of data provided by the cognitive products. Embodiments of the present invention also recognize that current approaches to analyzing cognitive products and determining a recommendation suffer from the inability to store the bulk of the data provided by cognitive products because cognitive products have high data acquisition requirements which lead to high storage requirements and as a result cause incomplete analysis and recommendations from incomplete data.

Embodiments of the present invention provide a method that stores and incorporates large amounts of data from multiple sources and integrates the data to provide a recommendation to a user to replace a cognitive product.

Figure 1:
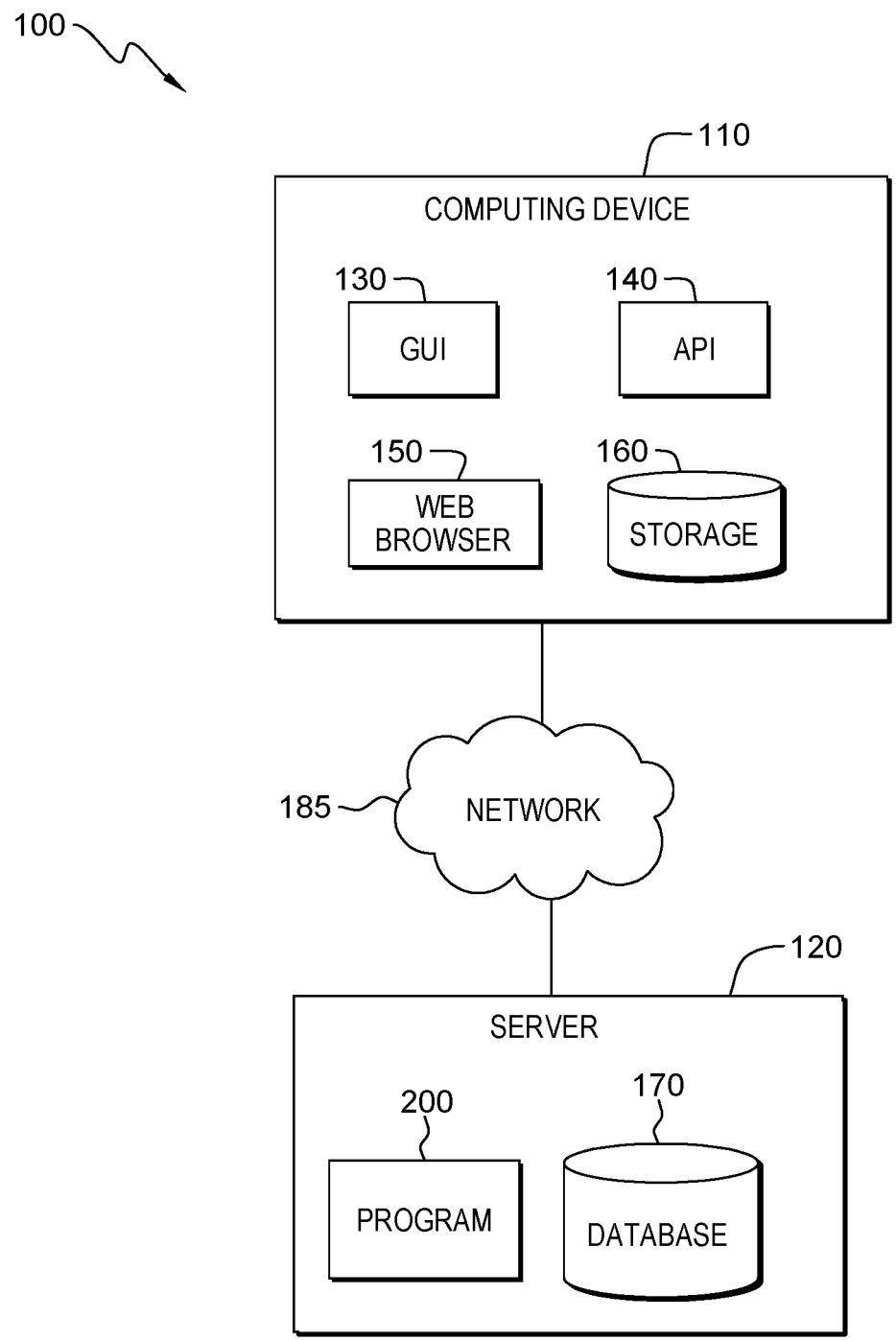
FIG. 1 is a functional block diagram illustrating a distributed data processing environment, in accordance with an embodiment of the present invention.

Example embodiments, in accordance with the present invention, will now be described in detail with reference to the Figures. FIG. 1 is a functional block diagram, illustrating distributed data processing environment 100. Distributed data processing environment 100 includes computing device 110 and server 120, interconnected over network 185.

In one embodiment, computing device 110 includes graphical user interface (GUI) 130, application programming interface 140, web browser 150, and storage 160. The various programs on computing device 110 include a web browser, an electronic mail client, security software (e.g., a firewall program, a geo-locating program, an encryption program, etc.), an instant messaging (IM) application (app), and a communication (e.g., phone) application.

Computing device 110 may be a desktop computer, a laptop computer, a tablet computer, a specialized computer server, a smartphone, a wearable device (e.g., smart watch, personal fitness device, personal safety device), or any programmable computer system known in the art with an interactive display or any other computer system known in the art. In certain embodiments, computing device 110 represents a computer system utilizing clustered computers and components that act as a single pool of seamless resources when accessed through network 185, as is common in data centers and with cloud-computing applications. In general, computing device 110 is representative of any programmable electronic device or combination of programmable electronic devices capable of executing machine-readable program instructions and communicating with other computer devices via a network.

In an embodiment, computing device 110 is a general purpose computer that program 200 analyzes to determine information associated with the performance of computing device 110. In another embodiment, computing device 110 is generally an IoT device, and specifically a cognitive product. In this embodiment, computing device 110 is an IoT device refers to a wide variety of devices, such as heart monitoring implants, biochip transponders on farm animals, cameras streaming live feeds of wild animals in coastal waters, automobiles with built-in sensors, DNA analysis devices for environmental/food/pathogen monitoring, or field operation devices that assist firefighters in search and rescue operations.

In an example, computing device 110 collects useful data with the help of various existing technologies and then autonomously disseminates the data between other devices. In this example, computing device 110 includes home automation (also known as smart home devices), such as the control and automation of lighting, heating (like smart thermostat), ventilation, air conditioning (HVAC) systems, and appliances, such as washer/dryers, robotic vacuums, air purifiers, ovens, or refrigerators/freezers that use Wi-Fi for remote monitoring.

In one embodiment, graphical user interface 130 operates on computing device 110. In another embodiment, graphical user interface 130 operates on another computer in a server based setting, for example on a server computer (e.g., server 120). In yet another embodiment, graphical user interface 130 operates on computing device 110 simultaneously with a server computer interconnected through network 185 (e.g., server 120). Graphical user interface 130 may be any user interface used to access information from computing device 110, such as information gathered or produced by program 200. Additionally, graphical user interface 130 may be any user interface used to supply information to computing device 110, such as information supplied by a user to be used by program 200. In some embodiments, graphical user interface 130 may present a generic web browser used to retrieve, present, and negotiate resources from the Internet. In other embodiments, graphical user interface 130 may be a software or application that enables a user at computing device 110 access to network 185.

In yet another embodiment, a user of computing device 110 can interact with graphical user interface 130 through a touch screen that performs as both an input device to a graphical user interface (GUI) and as an output device (i.e., an electronic display) presenting a plurality of icons associated with software applications or images depicting the executing software application. Optionally, a software application (e.g., a web browser) can generate graphical user interface 130 operating within the GUI of computing device 110. Graphical user interface 130 accepts input from a plurality of input/output (I/O) devices including, but not limited to, a tactile sensor interface (e.g., a touch screen or a touchpad) referred to as a multi-touch display. An I/O device interfacing with graphical user interface 130 may be connected to computing device 110, which may operate utilizing wired (e.g., USB port) or wireless network communications (e.g., infrared, NFC, etc.). Computing device 110 may include components, as depicted and described in further detail with respect to FIG. 3, in accordance with embodiments of the present invention.

Application programming interface 140 (API) specifies how software components should interact with each other. In an embodiment, API 140 can be in the form of an API library, which is essentially a basic library consisting of interfaces, functions, classes, structures, enumerations, etc. for building a software application. An API library can also include specifications for routines, data structures, object classes, and variables. In other embodiments, API 140 provides a specification of remote calls, allowing an application to cause a procedure to execute in another address space. API 140 is specific to a given technology. In an example, when client devices and servers interact, they rely on pre-determined versions of API 140 on the client application side and a compatible API method versions in the API library on the server side. In this example, the API versions of API 140 are modified when changes are made on the server side.

Web browser 150 may be a generic web browser used to retrieve, present, and traverse information resources from the Internet. In some embodiments, web browser 150 may be a web browser designed for a mobile device. In other embodiments, web browser 150 may be a web browser designed for a traditional computing device, such as a desktop computer, PC, or laptop. In general, web browser 150 may be any application or software that enables a user of computing device 110 to access a webpage over network 185. In the depicted environment, web browser 150 resides on computing device 110. In other embodiments, web browser 150, or similar web browsers, may reside on other computing devices capable of accessing a webpage over network 185.

Storage 160 (e.g., a database) located on computing device 110 represents any type of storage device capable of storing data that is accessed and utilized by computing device 110. In other embodiments, storage 160 represents multiple storage devices within computing device 110. Storage 160 stores information such as, but not limited to, account information, credentials for authentication, user preferences, lists of preferred users, previously visited websites, history of visited Wi-Fi portals, details of owned hardware from shopping history, invoices, and manually added data related to hardware on computing device 110. Storage 160 contains information about purchases or service requests for hardware derived from shopping data, electronic receipts, emails related to a product, help desk call logs and data related to service support tickets.

In general, network 185 can be any combination of connections and protocols that will support communications among computing device 110. Network 185 can include, for example, a local area network (LAN), a wide area network (WAN), such as the Internet, a cellular network, or any combination of the preceding, and can further include wired, wireless, and/or fiber optic connections.

Server 120 may be a desktop computer, a laptop computer, a tablet computer, a specialized computer server, a smartphone, or any other computer system known in the art. In certain embodiments, server 120 represents a computer system utilizing clustered computers and components that act as a single pool of seamless resources when accessed through network 185, as is common in data centers and with cloud-computing applications. In general, server 120 is representative of any programmable electronic device or combination of programmable electronic devices capable of executing machine-readable program instructions and communicating with other computer devices via a network. In one embodiment, server 120 includes database 170 and program 200.

In an embodiment, server 120 is capable of initiating a handshake process between server 120 and computing device 110. Handshaking is an automated process of negotiation that dynamically sets parameters of a communications channel established between two entities before normal communication over the channel begins. Handshaking follows the physical establishment of the channel and precedes normal information transfer. Handshaking facilitates connecting heterogeneous computing systems, or equipment, over a communication channel without the need for user intervention to set parameters. In an example, server 120 initiates the handshake process by sending a message to computing device 110 indicating that server 120 wants to establish a communication channel in order to gain access to programs on computing device 110.

Database 170 may be a repository that may be read by program 200. In an example embodiment, database 170 can include information, such as hardware information, service requests, logs of the product device, product documentation, online sources of information related to a product, such as forums devoted to a product, vendor websites, online shops, and auction site comments. In some embodiments, database 170 may access and retrieve information from another database or storage such as storage 160 located on computing device 110. In an example, program 200 may access other computing devices to retrieve data related to products purchased by the user. In other embodiments, a program on server 120 may prompt and update database 170 with information. The data stored to database 170 may be changed or updated by data input by a user, such as a user with access to server computer 120. In one embodiment, database 170 resides on server computer 120. In other embodiments, database 170 may reside on another server, another computing device, or mobile device, provided that database 170 is accessible to program 200. Database 170 operates to enhance program 200 by increasing the accuracy or amount of data available to program 200. Database 170 stores a history of information and data related to one or more products.

Figure 2:
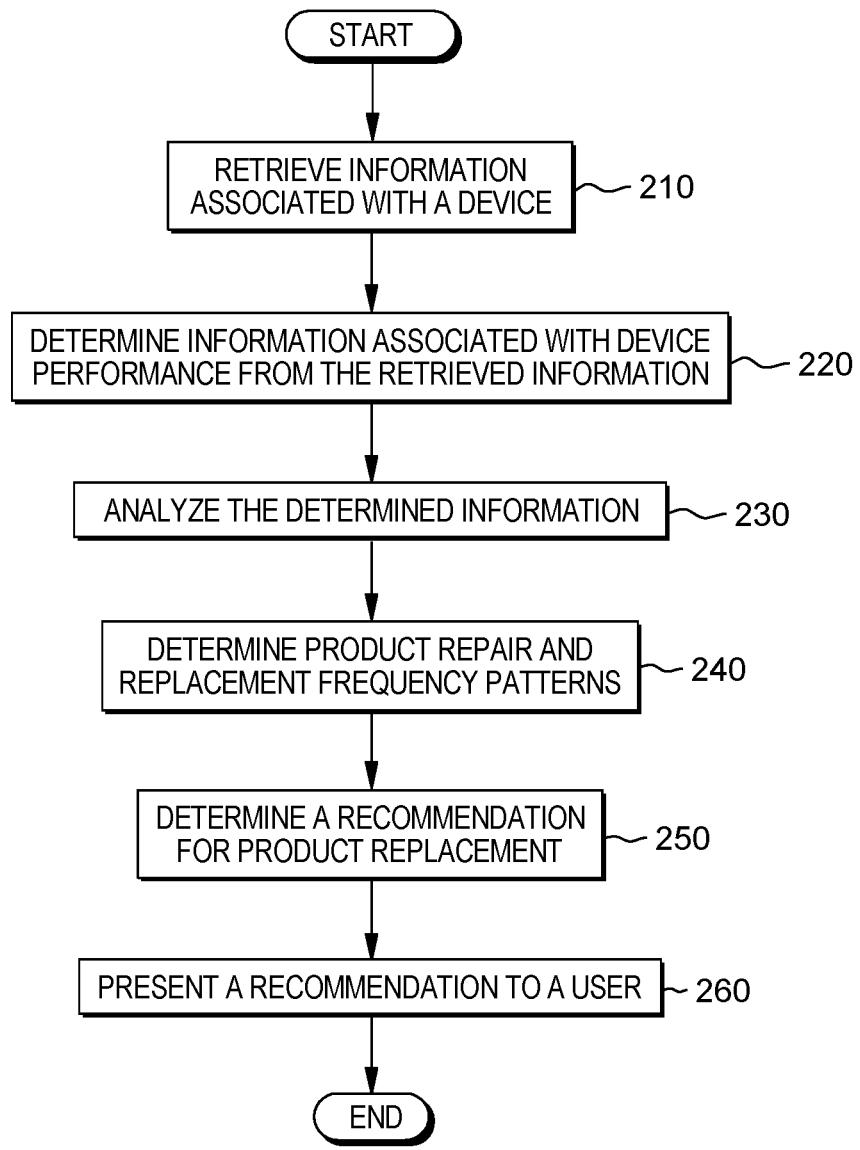
FIG. 2 is a flowchart depicting operational steps of program 200, a program for analyzing product repair patterns and providing a recommendation to a user, in accordance with an embodiment of the present invention.

FIG. 2 is a flowchart depicting operational steps of program 200, a program for analyzing product repair patterns and providing a recommendation to a user, in accordance with an embodiment of the present invention.

In step 210, program 200 retrieves information associated with a device. In an embodiment, program 200 retrieves information from a plurality of databases. In an example, program 200 identifies and retrieves information from database 170, on computing device 110, and storage 160, related to details of hardware information of a cognitive product, service requests of a cognitive product based on the cognitive product's registration in one or more manufacturer databases, logs of the cognitive product as periodically recorded, documents about cognitive products, service logs of the cognitive product, documentation about a cognitive product, and purchase information about a cognitive product. In this example, program 200 retrieves information from storage 160 related to a shopping history, invoices, instruction manuals, and a cognitive product service request for a hardware element of a cognitive product.

In another embodiment, program 200 retrieves data from an analysis of the computing device 110. In an example, computing device 110 is a cognitive device operating to control the lighting in a home automation configuration. Program 200 retrieves information from computing device 110 specific to the analytics of the lighting fixtures in the home automation configuration, such as light device power consumption and light device bulb half-life.

In another embodiment, program 200 accesses the Internet to retrieve online sources of information related to online forums, online vendors of the cognitive product, online shops and commentary, and auction sites. In an example, program 200 retrieves information related to commentary on the performance of a cognitive product from an online auction site and an online vendor site. In this example, program 200 retrieves a plurality of information related to one of more cognitive products of interest to a user from the web site.

In step 220, program 200 determines information associated with device performance from the retrieved information. In an embodiment, program 200 determines information retrieved in step 210 as part of a determination of the functional state of the emergency lighting system every fourteen days. Program 200 determines information associated with the functional state of the emergency lighting device that is relevant to program 200. In an example, program 200 analyzes the entire lighting system: lamp and battery state, battery charging, external communications, correct operation of the power stage, etc., to determine the status of each device at any given point in time. In this example, program 200 determines information associated with the performance of the emergency lighting system as an irregularity based on the retrieved information and normal system status of the other components of the lighting system.

In step 230, program 200 analyzes the determined information. In an embodiment, program 200 analyzes the determined irregularity of the emergency lighting system. Program 200 analyzes the mean time between failures (MTBF) for the emergency lighting system. According to the manufacturer literature for the emergency lighting system, the mean time between failures (MTBF) is a statistical measure defining the time at which fifty percent of the large components in the emergency lighting system have failed. In this example, program 200 determines that the MTBF for the emergency lighting system is the time at which fifty percent of the large components in the emergency lighting system still have a minimum predefined performance level at between fifty or seventy percent of the initial value of the lumen output factor. Program 200 analyzes the other large components on the emergency lighting system to determine that operating temperature, operational voltage, and operational current of the emergency lighting system is still operating at least within the fifty to seventy percent initial output. Program 200 determines that the (MTBF) will be less than the 50,000 hour lifetime of the emergency lighting system based on an analysis of the environmental temperature conditions of the emergency lighting system being less than the optimal eight to eighty-five degree Celsius range.

Program 200 analyzes the determined information for details of irregularities by combining details of the owned cognitive product from a user's shopping history, such as the date when the user purchased the cognitive product, and online documents about the cognitive product that detail the specifications of individual components of the cognitive product. In this example, program 200 analyzes online commentary related to the emergency lighting system in conjunction with logs of the cognitive product that result from a user registering the cognitive product into one or more manufacturer databases.

In another example, product 200 analyzes the plurality of information retrieved in step 210 to determine that the batteries of a cognitive product have a thirty-day lifespan. In this example, program 200 determines that the thirty-day lifespan for the battery will be consistent with the cognitive product's declining performance as the battery performance is diminished. In this example, program 200 is capable of incorporating information from one or more forums dedicated to the cognitive product's performance, and battery performance, to determine that patterns of further declining cognitive product performance in a thirty-day time frame is relevant to determining that another component of the device must be experiencing failure.

In step 240, program 200 determines product repair and replacement frequency patterns. In an embodiment, program 200 analyzes the determined information of a cognitive product's performance, from step 230, to determine a replacement frequency pattern. In an example, product 200 utilizes the information from step 230 to determine that the batteries for a cognitive product are replaced every twenty-nine days. In this example, program 200 analyzes a history of performance showing that the cognitive product's performance reaches a new peak, consistent with the last month's peak performance, at twenty-nine day intervals. Program 200 analyzes invoices, and a shopping history of the user, and determines that a battery order is placed on the twenty-fourth day of each month, and the battery is received on or before every twenty-eighth day of the month.

In another embodiment, program 200 determines a repair frequency for a cognitive product. In an example, program 200 analyzes information from step 220 to determine that every year for the past ten years, on the first day of December, a cognitive product's electrical system experiences failure. Program 200 determines that based on the low MTBF of the electrical system of the cognitive product, the shorter the system will work before failing. Program 200 incorporates data from the sources in step 210 to determine that a cognitive product's electrical failure is caused by a design defect. The design defect results in the cognitive product being out of service, even with the expected peak performance of the monthly replaced battery. Program 200 incorporates monthly replacement information, and yearly repair information based on repair logs, from storage 160 and database 170, to determine the frequency for replacement of components of the cognitive product, and the repair of systems of the cognitive product.

In another embodiment, program 200 determines a new MTBF, and new product replacement pattern for the emergency lighting system. In an example, program 200 utilizes the information from step 220 and step 230 to calculate a new MTBF for the emergency lighting system. In this example, program 200 incorporates information from the expected (MTBF) of the emergency lighting system utilized in step 230. In this example, at optimal environmental temperature conditions, the emergency lighting system is expected to have 50,000 hours as the predicted (MTBF). Program 200, in step 230, analyzed the environmental temperature conditions are higher than the optimal conditions thus leading to a different actual (MTBF) for the emergency lighting system. In this example, program 200 determines the (MTBF) to be less than predicted, having already analyzed the power components to be operating at a higher temperature, because the analysis by program 200 of the (MTBF) at higher temperature conditions results in a (MTBF) of 40,000 hours. Program 200 compares the predicted (MTBF) of 50,000 hours, with the newly determined (MTBF) of 40,000 hours, is a 10,000 hour loss of efficiency. Program 200 determines a new replacement schedule of 40,000 hours based on the analysis in step 230.

In step 250, program 200 determines a recommendation for product replacement. In an embodiment, program 200 incorporates all the information from step 220 to step 240 to determine a recommendation to a user for the replacement of a cognitive product's electrical system and repair of a cognitive product. In an example, program 200 determines that based upon a new (MTBF), as calculated in step 240 based on the determined irregularity with respect to the expected (MTBF), an emergency lighting system suited to higher temperatures. In this example, program 200 determines that the (MTBF), as predicted based upon information derived from step 240, is less than expected because of the emergency system being unable to function optimally at higher temperature environments. Program 200 determines a recommendation for the components of the system being suited for higher temperatures.

In another embodiment, program 200 determines that based upon the lower expected battery life for the batteries of the cognitive product, that another element of the cognitive product is consuming a higher than expected amount of power. In an example, program 200 analyzes other components of the cognitive product to determine the component of the cognitive product that is malfunctioning based upon the higher power consumption. In this example, program 200 determines a recommendation for the user to replace the component of the cognitive device that is malfunctioning and consuming an elevated amount of power and affecting the battery performance.

In another embodiment, program 200 determines that based upon the high rate of battery consumption and analysis of other systems as reading as functioning properly, a recommendation to contact the hardware vendor for the cognitive product. In an example, program 200 provides a recommendation to a user to contact the vendor of the cognitive product due to the fact that the cognitive product is consuming a high amount of power in light of the fact that other power consuming systems in the cognitive product indicate that the other systems are operating normal.

In step 260, program 200 presents recommendation to a user. In an embodiment, program 200 presents the recommendation, determined in step 240, to a user through GUI 130. In an example, program 200 analyzes the performance and frequency of replacement of a battery in a cognitive device. Program 200 determines one or more recommendations to a user based upon the higher or lower than expected performance of the battery of a cognitive device. Program 200 presents the determination and component that program 200 determined as being defective.

In another embodiment, program 200 presents the recommendation to the user in conjunction with a confirmation of the action that program 200 enacted in response to the failing product in the cognitive device. In this example, program 200 presents information to the user of multiple system failures, and a confirmation, and addition to the cognitive product log, that program 200 contacted the hardware vendor to analyze the information of failure of one or more components of the cognitive product.

Figure 3:
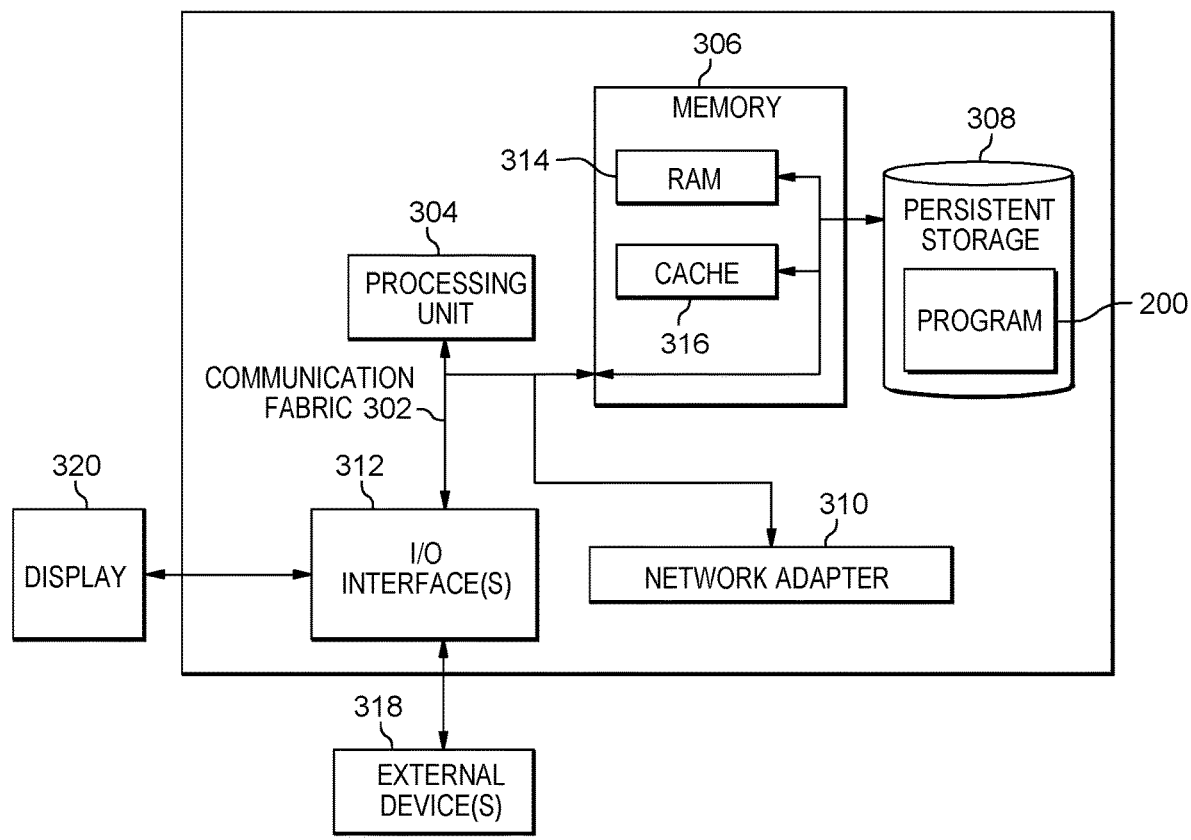
FIG. 3 is a block diagram of components of a computer system, such as the server computer of FIG. 1, in an embodiment in accordance with the present invention.

FIG. 3 depicts a block diagram of components of server 120, in accordance with an illustrative embodiment of the present invention. It should be appreciated that FIG. 3 provides only an illustration of one implementation and does not imply any limitations with regard to the environments in which different embodiments may be implemented. Many modifications to the depicted environment may be made.

Server 120 includes communications fabric 302, which provides communications between cache 316, memory 306, persistent storage 308, network adapter 310, and input/output (I/O) interface(s) 312. Communications fabric 302 can be implemented with any architecture designed for passing data and/or control information between processors (such as microprocessors, communications and network processors, etc.), system memory, peripheral devices, and any other hardware components within a system. For example, communications fabric 302 can be implemented with one or more buses or a crossbar switch.

Memory 306 and persistent storage 308 are computer readable storage media. In this embodiment, memory 306 includes random access memory (RAM). In general, memory 306 can include any suitable volatile or non-volatile computer readable storage media. Cache 316 is a fast memory that enhances the performance of computer processor(s) 304 by holding recently accessed data, and data near accessed data, from memory 306.

Program 200 may be stored in persistent storage 308 and in memory 306 for execution by one or more of the respective computer processors 304 via cache 316. In an embodiment, persistent storage 308 includes a magnetic hard disk drive. Alternatively, or in addition to a magnetic hard disk drive, persistent storage 308 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 308 may also be removable. For example, a removable hard drive may be used for persistent storage 308. Other examples include optical and magnetic disks, thumb drives, and smart cards that are inserted into a drive for transfer onto another computer readable storage medium that is also part of persistent storage 308.

Network adapter 310, in these examples, provides for communications with other data processing systems or devices. In these examples, network adapter 310 includes one or more network interface cards. Network adapter 310 may provide communications through the use of either or both physical and wireless communications links. Program 200 may be downloaded to persistent storage 308 through network adapter 310.

I/O interface(s) 312 allows for input and output of data with other devices that may be connected to server computer 120. For example, I/O interface 312 may provide a connection to external devices 318 such as a keyboard, keypad, a touch screen, and/or some other suitable input device. External devices 318 can also include portable computer readable storage media such as, for example, thumb drives, portable optical or magnetic disks, and memory cards. Software and data used to practice embodiments of the present invention, e.g., program 200, can be stored on such portable computer readable storage media and can be loaded onto persistent storage 308 via I/O interface(s) 312. I/O interface(s) 312 also connect to a display 320.

Display 320 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for determining recommendations for actions based on analysis of a device, the method comprising:
    retrieving, by one or more processors, information associated with a device from one or more databases;
    determining, by one or more processors, information relevant to device performance as a function of an analysis of the retrieved information associated with the device, wherein information relevant to device performance includes one or more factors related to an expected device performance;
    determining, by one or more processors, a frequency of repair and replacement of one or more components of the device, comprising:
        determining a mean time between failure of the device, and
        determining repair frequency patterns of the device by comparing the determined mean time between failure of the device to an industry standard of expected performance of the device; and
    determining, by one or more processors, a recommendation of an action based on a comparison of an expected frequency of replacement and repair of the components of the device to the determined replacement and repair of the components of the device.

2. The method of claim 1, further comprising:
    presenting, by one or more processors, the determined recommendation to the user.

3. The method of claim 1, wherein the retrieved information associated with the device is selected from the group consisting of:
    documentation associated with the device, service requests of the device based on registration of the device in one or more manufacturer databases, service logs of the device, and purchase information associated with the device.

4. The method of claim 1, wherein determining information relevant to device performance as a function of an analysis of the retrieved information associated with the device further comprises:
    generating, by one or more processors, a pattern of performance metrics of the device based on a plurality of historical reports of device performance metrics during a defined period of time;
    determining, by one or more processors, malfunctions in specific components of the device based on an analysis of the pattern of device performance metrics; and
    determining, by one or more processors, an expected life span for the device, wherein the expected life span for the device is a function of performance patterns of individual components of the device compared to expected performance information of individual components of the device in a manufacturer database.

5. The method of claim 1, wherein determining a frequency of repair and replacement of one or more components of the device further comprises:
    generating, by one or more processors, a new schedule for replacement of one or more components of the device based upon determined repair frequency pattern.

6. The method of claim 1, wherein determining a recommendation of an action based on a comparison further comprises:
    determining, by one or more processors, one or more components of the device to schedule for replacement by replacement components that meet device requirements; and
    retrieving, by one or more processors, information associated with of the replacement components from one or more retail web sites.

7. The method of claim 1, wherein the device is an Internet of things (IoT) enabled device.

8. A computer program product for determining recommendations for actions based on analysis of a device, the computer program product comprising:
- one or more computer readable tangible storage media and program instructions stored on at least one of the one or more computer readable storage media, the program instructions readable/executable by one or more computer processors and further comprising:
- program instructions to retrieve information associated with a device from one or more databases;
- program instructions determine information relevant to device performance as a function of an analysis of the retrieved information associated with the device, wherein information relevant to device performance includes one or more factors related to an expected device performance;
- program instructions determine a frequency of repair and replacement of one or more components of the device, comprising:
- determining a mean time between failure of the device, and determining repair frequency patterns of the device by comparing the determined mean time between failure of the device to an industry standard of expected performance of the device;
- and program instructions determine a recommendation of an action based on a comparison of an expected frequency of replacement and repair of the components of the device to the determined replacement and repair of the components of the device.

9. The computer program of claim 8, further comprising program instructions, stored on the one or more computer readable storage media, which when executed by a processor, cause the processor to:
- present the determined recommendation to the user.

10. The computer program of claim 8, wherein the retrieved information associated with the device is selected from the group consisting of:
- documentation associated with the device, service requests of the device based on registration of the device in one or more manufacturer databases, service logs of the device, and purchase information associated with the device.

11. The computer program of claim 8, wherein the program instructions to determine information relevant to device performance as a function of an analysis of the retrieved information associated with the device further comprises program instructions, stored on the one or more computer readable storage media, which when executed by a processor, cause the processor to:
- generate a pattern of performance metrics of the device based on a plurality of historical reports of device performance metrics during a defined period of time;
- determine malfunctions in specific components of the device based on an analysis of the pattern of device performance metrics; and
- determine an expected life span for the device, wherein the expected life span for the device is a function of performance patterns of individual components of the device compared to expected performance information of individual components of the device in a manufacturer database.

12. The computer program of claim 8, wherein the program instructions to determine a frequency of repair and replacement of one or more components of the device further comprises program instructions, stored on the one or more computer readable storage media, which when executed by a processor, cause the processor to:
- generate a new schedule for replacement of one or more components of the device based upon determined repair frequency pattern.

13. The computer program of claim 8, wherein the program instructions to determine a recommendation of an action based on a comparison further comprises program instructions, stored on the one or more computer readable storage media, which when executed by a processor, cause the processor to:
- determine one or more components of the device to schedule for replacement by replacement components that meet device requirements; and
- retrieve information associated with of the replacement components from one or more retail web sites.

14. The computer program of claim 8, wherein the device is an Internet of things (IoT) enabled device.

15. A computer system for determining recommendations for actions based on analysis of a device, the computer system comprising:
- one or more computer processors;
- one or more computer readable storage media; and
- program instructions stored on the one or more computer readable storage media for execution by at least one of the one or more computer processors, the program instructions comprising:
- program instructions to program instructions to retrieve information associated with a device from one or more databases;
- program instructions determine information relevant to device performance as a function of an analysis of the retrieved information associated with the device, wherein information relevant to device performance includes one or more factors related to an expected device performance;
- program instructions determine a frequency of repair and replacement of one or more components of the device, comprising:
- determining a mean time between failure of the device, and determining repair frequency patterns of the device by comparing the determined mean time between failure of the device to an industry standard of expected performance of the device; and
- program instructions determine a recommendation of an action based on a comparison of an expected frequency of replacement and repair of the components of the device to the determined replacement and repair of the components of the device.

16. The computer system of claim 15, further comprising program instructions, stored on the one or more computer readable storage media, which when executed by a processor, cause the processor to:
- present the determined recommendation to the user.

17. The computer system of claim 15, wherein the retrieved information associated with the device is selected from the group consisting of:
- documentation associated with the device, service requests of the device based on registration of the device in one or more manufacturer databases, service logs of the device, and purchase information associated with the device.

18. The computer system of claim 15, wherein the program instructions to determine information relevant to device performance as a function of an analysis of the retrieved information associated with the device further comprises program instructions, stored on the one or more computer readable storage media, which when executed by a processor, cause the processor to:

generate a pattern of performance metrics of the device based on a plurality of historical reports of device performance metrics during a defined period of time;

determine malfunctions in specific components of the device based on an analysis of the pattern of device performance metrics; and determine an expected life span for the device, wherein the expected life span for the device is a function of performance patterns of individual components of the device compared to expected performance information of individual components of the device in a manufacturer database.

19. The computer system of claim 15 wherein the program instructions to determine a frequency of repair and replacement of one or more components of the device further comprises program instructions, stored on the one or more computer readable storage media, which when executed by a processor, cause the processor to:

generate a new schedule for replacement of one or more components of the device based upon determined repair frequency pattern.

20. The computer system of claim 15 wherein the program instructions to determine a recommendation of an action based on a comparison further comprises program instructions, stored on the one or more computer readable storage media, which when executed by a processor, cause the processor to:

determine one or more components of the device to schedule for replacement by replacement components that meet device requirements; and retrieve information associated with of the replacement components from one or more retail web sites.

* * * * *